United States Patent
Haddad et al.

[11] Patent Number: 6,122,198
[45] Date of Patent: Sep. 19, 2000

[54] BIT BY BIT APDE VERIFY FOR FLASH MEMORY APPLICATIONS

[75] Inventors: Sameer Shafiq Haddad, San Jose; Ravi Prakash Gutala, Milpitas; Colin Bill, Cupertino, all of Calif.

[73] Assignee: Advanced Micro Devices, Inc., Sunnyvale, Calif.

[21] Appl. No.: 09/413,182

[22] Filed: Oct. 5, 1999

Related U.S. Application Data

[60] Provisional application No. 60/148,782, Aug. 13, 1999.

[51] Int. Cl.$^7$ ..................................................... G11C 11/34
[52] U.S. Cl. ........................................................ 365/185.22
[58] Field of Search ........................... 365/185.18, 185.2, 365/185.21, 185.22, 185.24, 185.29, 185.3, 185.33, 218

[56] References Cited

U.S. PATENT DOCUMENTS

| | | | |
|---|---|---|---|
| 5,237,535 | 8/1993 | Mielke et al. | 365/185.22 |
| 5,642,311 | 6/1997 | Cleveland et al. | 365/185.29 |
| 5,732,019 | 3/1998 | Urai | 365/185.29 |
| 5,901,090 | 5/1999 | Haddad et al. | 365/185.29 |

*Primary Examiner*—Trong Phan
*Attorney, Agent, or Firm*—H. Donald Nelson

[57] ABSTRACT

A method of erase verifying and overerase verifying an array of flash memory cells by erase verifying each memory cell bit-by-bit in a memory array, overerase verifying each memory cell bit-by-bit in the memory array after each memory cell verifies as erased and again erase verifying each memory cell bit-by-bit in the memory array after each cell overerase verifies. The threshold voltage of each memory cell is compared to the threshold voltage of a reference memory cell and an overerase correction pulse is applied to the column in which the overerased memory cell is located.

6 Claims, 8 Drawing Sheets

BIT BY BIT APDE VERIFY FOR FLASH MEMORY APPLICATIONS

This application claims the benefit of Provisional Application No. 60/148,782, filed Aug. 13, 1999.

BACKGROUND OF THE INVENTION

1. Field of the Invention

This invention relates generally to a semiconductor integrated circuit memory device that includes an array of flash EEPROM memory cells. More specifically, this invention relates to a semiconductor integrated circuit memory device that includes an array of flash EEPROM memory cells and a method for providing reliable and accurate overerase correction of overerased flash memory cells. Even more specifically, this invention relates to a semiconductor integrated circuit memory device that includes an array of flash EEPROM memory cells and a method for providing bit-by-bit APDE verify of the flash EEPROM memory cells.

2. Discussion of the Related Art

FIG. 1 shows a typical configuration for an integrated circuit including a flash EEPROM memory array 100 and circuitry enabling programming, erasing, reading, and overerase correction of the memory cells in the array 100. The flash EEPROM array 100 is composed of multiple individual cells, such as cell 102. Each cell has a drain connected to a bitline, such as bitline 104, each bitline being connected to a bitline pull-up circuit 106 and column decoder 108. The source of each cell is connected to a common terminal, $V_{SS}$. The control gate of each cell is connected to a wordline, such as wordline 109, that is connected to a row decoder 110.

The row decoder 110 receives voltage signals from a power supply 112 and distributes the particular voltage signals to the wordlines as controlled by a row address received from a processor or state machine 114. Likewise, the bitline pull-up circuit 106 receives voltage signals from the power supply 112 and distributes the particular voltage signals to the bitlines as controlled by a signal from the processor 114. Voltages provided by the power supply 112 are controlled by signals received from processor 114.

The column decoder 108 provides signals from particular bitlines to sense amplifiers or comparators 116 as controlled by a column address signal received from processor 114. The sense amplifiers 116 further receive signals from reference cells of reference array 118. An example of circuitry for reference array 118, as well as operation of such circuitry is provided in U.S. Pat. No. 5,828,601, entitled "Programmed Reference," and U.S. Pat. No. 5,335,198 entitled "Flash EEPROM Array With High Endurance," both of which are incorporated herein by reference. With signals from the column decoder 108 and reference array 118, the sense amplifiers 116 provide a signal indicating a state of a bitline relative to a reference cell line to which it is connected through data latches or buffers 120 to processor 114.

To program a cell in the flash memory array 100, high gate and drain voltage pulses are provided to the cell from power supply 112 while the source of the cell is grounded. For instance, during programming multiple gate voltage pulses of typically 10 volts are each applied for approximately two to three microseconds to a cell, while the drain voltage of the cell is set typically to 5.5 volts and the source of the cell is grounded. The large gate and drain voltage pulses enable electrons flowing from the source to drain to overcome an energy barrier to become "hot electrons" that are able to cross a thin dielectric layer onto the floating gate of the cell. This programming procedure, termed "hot electron injection" results in an increase of the threshold voltage for the cell, the threshold voltage being the gate-to-source voltage required for the cell to conduct.

To erase a cell in the flash memory array 100, a procedure known as Fowler-Nordheim tunneling is utilized wherein relatively high negative gate-to-source voltage pulses are applied to the cell for a few tenths of a second each. For instance, during erase multiple voltage pulses of minus 10 volts are applied to the control gate of the cell, the drain of the cell is floated and the source of the cell is set to a voltage of less than 6 volts. The large negative gate-to-source voltage pulses enable electrons to tunnel from the floating gate of a cell thereby reducing the cell's threshold voltage.

To represent a data bit, the floating gate of a cell is programmed or erased as described above. In a programmed state, the threshold voltage of a cell is typically set at a voltage of greater than 5 volts, while the threshold voltage of a cell in an erased state is typically limited to a voltage below 3.0 volts. To read a cell, a voltage in the range of 3.0 to 6 volts, typically 5 volts, is applied to the control gate. The 5 volt read pulse is applied to the gate of an array cell as well as to a cell in the reference array 118 having a threshold voltage of 5 volts. In a programming state with an array cell in array 100 having a threshold voltage above 5 volts, current provided by the reference cell with a threshold voltage of 5 volts will be greater thereby indicating a programmed cell. In an erased state with a threshold voltage of a cell in array 100 below 3.0 volts, current provided by the array cell will be greater than the reference cell with a threshold voltage of 3 volts indicating an erased cell. To verify programming or erase, a read voltage is similarly applied to both a cell in the array and to a cell in the reference array 118. For programming, a reference cell having a threshold of 5 volts is used for a comparison, while for erase, a reference cell having a threshold voltage of 3.0 volts is used for comparison.

In a typical flash memory array, all cells are erased simultaneously. Erasing of the memory cells is typically done by repeated applications of the short erase pulses as described above which are applied to each of the cells in an array, such as the flash memory array 100. After each erase pulse, erase verify is performed cell by cell to determine if each cell in the array has a threshold voltage above a limit, such as 3.0 volts. This limit is called "$V_t$max" and a cell that has a threshold voltage above $V_t$max is "undererased." If an undererased cell is detected, an additional erase pulse is applied to the entire array. With such an erase procedure, a cell that is not undererased will also be repeatedly erased and its floating gate may eventually acquire a threshold voltage below a minimum voltage called "$V_t$min." A cell with a threshold voltage below $V_t$min is referred to as being "overerased."

An overerased condition is undesirable because the programming characteristics of an overerased cell tend to deteriorate more rapidly, which reduces the number of times the cell can be programmed. The number of times that a cell can be programmed is referred to as the endurance of the cell. Overerased cells are also undesirable because they create bitline leakage current during program or read of the cell. For instance, during program or read, only one wordline carries a positive voltage, while the remaining wordlines are typically grounded. With wordlines grounded, or at 0 volts, a cell with a threshold voltage below $V_t$min will conduct a small but finite bitline leakage current. With substantial bitline leakage current, power supplies providing power to a bitline during programming may become overloaded. Similarly, with bitline leakage current during read, read errors may occur.

FIG. 5 illustrates the undesirable effect of bitline leakage current during programming. FIG. 5 is a simplified electrical schematic diagram of a column 500 of flash EEPROM cells 502, 504, 506, and 508. The source of each cell in the column 500 of cells is connected to a common source supply voltage $V_S$. A programming voltage is applied to the control gate of the cell 504, which turns it on. A current $I_2$ flows through the cell 504 from ground through the source of the cell, the channel (not shown) of the cell and the drain of the cell into the bitline BL. Ideally, the bitline current $I_{BL}$ is equal to $I_2$. However, if one or more of the unselected cells, 502, 506 or 508 as illustrated in FIG. 5, have a low threshold or are overerased leakage currents $I_1$, $I_3$, and $I_4$ could flow through the transistors 502, 506, and 508, respectively. The bitline current $I_{BL}$ would then be equal to the sum of $I_2$ and the leakage currents $I_1$, $I_3$ and $I_4$. In a typical flash EEPROM, the drains of a large number of memory transistor cells, for example 512 transistor cells are connected to each bitline. If a substantial number of cells on the bitline are drawing leakage current, the total leakage current on the bitline could exceed the cell read current. This makes it impossible to read the state of any cell on the bitline and therefore renders the memory inoperative. If a substantial number of cells on the bitline are drawing leakage current during programming, the total leakage current could exceed the capacity of the power supply thereby causing unreliable programming.

To prevent overerase, manufacturers of integrated circuits containing flash memory cells typically provide an overerase correction mechanism. FIG. 2 is a flowchart illustrating a prior art erase and overerase correction procedure. In the procedure, erase is performed first, and then overerase correction is provided. The procedure of FIG. 2 will be described in more detail below.

First, for the erase procedure, in steps 202 and 204, the row address and column address provided by processor 114 (FIG. 1) are set to an initial address. Next, in steps 206 and 208, an erase verify pulse is provided to a cell as selected by the row and column addresses. Outputs from sense amplifiers 116 (FIG. 1) are then utilized by processor 114 (FIG. 1) to determine if the cell referenced by the row and column addresses is undererased. If the cell is undererased, an erase pulse is applied in step 209 to the entire array and the erase verify steps 206 and 208 are repeated.

If the cell referred to by the row and column addresses is determined to not be undererased in steps 206 and 208, the column address is incremented in step 210. Next, in step 212, if the last column address has not been exceeded, control returns to step 206. Otherwise, in step 214 the row address is incremented, and if the last row address has not been exceeded in step 216, control is returned to step 204. If the last row has been exceeded, the column address is reset in step 218 to begin the overerase correction procedure.

Next, in the overerase correction procedure, in steps 220 and 222, power supply 112 (FIG. 1) is controlled to provide an overerase verify pulse to the bitline of the cells referred to by the column address, while wordlines remain grounded. Outputs from sense amplifiers 116 (FIG. 1) are then provided to the processor 114 (FIG. 1) to determine if the bitline referenced by the column address is providing a leakage current. If the bitline is providing a leakage current, one or more overerased cells exist, so in step 223 power supply 112 is controlled to provide an overerase correction pulse to all of the cells connected to the bitline referred to by the column address and step 220 is then repeated.

The overerase correction pulse applied in step 223 is a relatively high voltage applied to the drain of a cell, such as 6 volts, while its gate and source are typically grounded. U.S. Pat. No. 5,359,558 entitled "Flash EEPROM Array With Improved High Endurance," incorporated herein by reference discloses further details regarding application of overerase correction pulses.

If no bitline leakage current is identified in step 222, the column address is incremented in step 224. Next, in step 226, if the last column address has not been exceeded, control is returned to step 220. Otherwise, the overerase correction procedure is complete as indicated at 228.

Because overerased cells may have been present during erase verify in step 206, undererased, or programmed cells may still be present after the erase procedure is complete. In explanation, during erase, one cell in an array may erase on the order of 100 times faster than other cells. If the cell verified in step 206 is erased very slowly, while a cell in the same column is erased rapidly by continual applications of the erase pulse of step 209, the cell in the same column that erases faster may become overerased before the cell addressed in step 206 is verified as properly erased. Since during verify in step 206, the remaining cells on the column other than the cell addressed have grounded wordlines, the overerased cell will conduct a bitline leakage current. With such bitline leakage current adding to the current conducted by the addressed cell, a sense amplifier comparing the current of the addressed cell to current of a reference cell in reference array 118 will prematurely indicate for step 206 that the addressed cell has been properly erased. Thus, after completion of erase, cells may remain undererased.

FIG. 3 is a flowchart illustrating another prior art erase and overerase correction procedure. In the procedure, overerase correction is applied after application of each erase pulse. The procedure of FIG. 3 will be described in more detail below.

First, similar to FIG. 2, in steps 302 and 304, the row address and column address provided by the processor 114 (FIG. 1) are set to an initial address. Next, in steps 306 and 308, an erase verify pulse is provided to a cell as selected by the row and column addresses. Outputs from sense amplifiers 116 (FIG. 1) are then utilized by processor 114 (FIG. 1) to determine if the cell referenced by the row and column addresses is undererased. If the cell is undererased, an erase pulse is applied to the array in step 309.

Unlike the flowchart of FIG. 2, which after step 309 returns to erase verify in step 306, the column address provided by processor 114 (FIG. 1) is reset to an initial address in step 310 to begin an overerase correction procedure.

Next, in the overerase correction procedure, in steps 312 and 314, power supply 112 (FIG. 1) is controlled to provide an overerase verify pulse to the bitline of the cells referred by the column address, while wordlines remain grounded. Outputs from sense amplifiers 116 (FIG. 1) are then provided to the processor 114 (FIG. 1) to determine if there is a cell on the bitline referenced by the column address that is overerased and providing a leakage current. If there is an overerased cell on the bitline, an overerase correction pulse is applied to all the cells connected to the bitline and steps 312 and 314 are repeated.

If no overerased cells are identified in steps 312 and 314, the column address is incremented in step 316. Next, in step 318, if the last column address has not been exceeded, control is returned to step 312. Otherwise, control is returned from step 318 to 304 to return to the erase procedure.

Once the cell referred to by the row address and column address is determined to be not undererased in step 306, the column address is incremented in step 320. Next, in step 322, if the last column address has not been exceeded, control returns to step 306. Otherwise, in step 324 the row address is incremented, and if the last row address has not been exceeded in step 326, control is returned to step 306. If the last column and row have been exceeded, the combined erase and overerase procedure is complete as indicated at 328.

By applying the overerase correction procedure after each erase pulse as shown in FIG. 3, the extent to which cells are overerased will be reduced relative to the method described in FIG. 2 improving the endurance of cells in the array. Further because overerased cells are removed after each erase pulse, bitline leakage current will not be present during erase verify, thus preventing undererased cells from existing upon completion of the erase procedure.

However, the methods described by the flowcharts in FIGS. 2 and 3 do not allow the accurate determination if there are, in fact, overerased cells connected to the bitline being overerase verified. This can occur because all of the wordlines connected to the cells being overerase verified are grounded and there may be leakage current that prevents an accurate determination of whether there may be one or more cells that are overerased.

Therefore, what is needed is an accurate and reliable method of overerase verifying and overerase correction that ensures that all of the cells are actually not overerased.

SUMMARY OF THE INVENTION

According to the present invention, the foregoing and other objects and advantages are achieved by a method of bit-by-bit erase verifying, bit-by-bit overerase verifying and bit-by-bit erase verifying a second time an array of flash memory cells.

In accordance with another aspect of the invention, if erase pulses have been applied to the memory array during the second erase verify procedure, a further overerase verify procedure is done.

In accordance with another aspect of the invention, the threshold voltage of each of the memory cells is compared to a threshold voltage of a reference cell and an overerase correction pulse is applied to the column in which the overerased cell is located.

The described method thus provides a method of erase verifying and overerase verifying an array of memory cells that allows an accurate determination of which cells are overerased further allowing the overerased cells to be reliably overerase corrected.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention that illustrates the best mode presently contemplated by the inventors for practicing the invention.

Figure 4A:
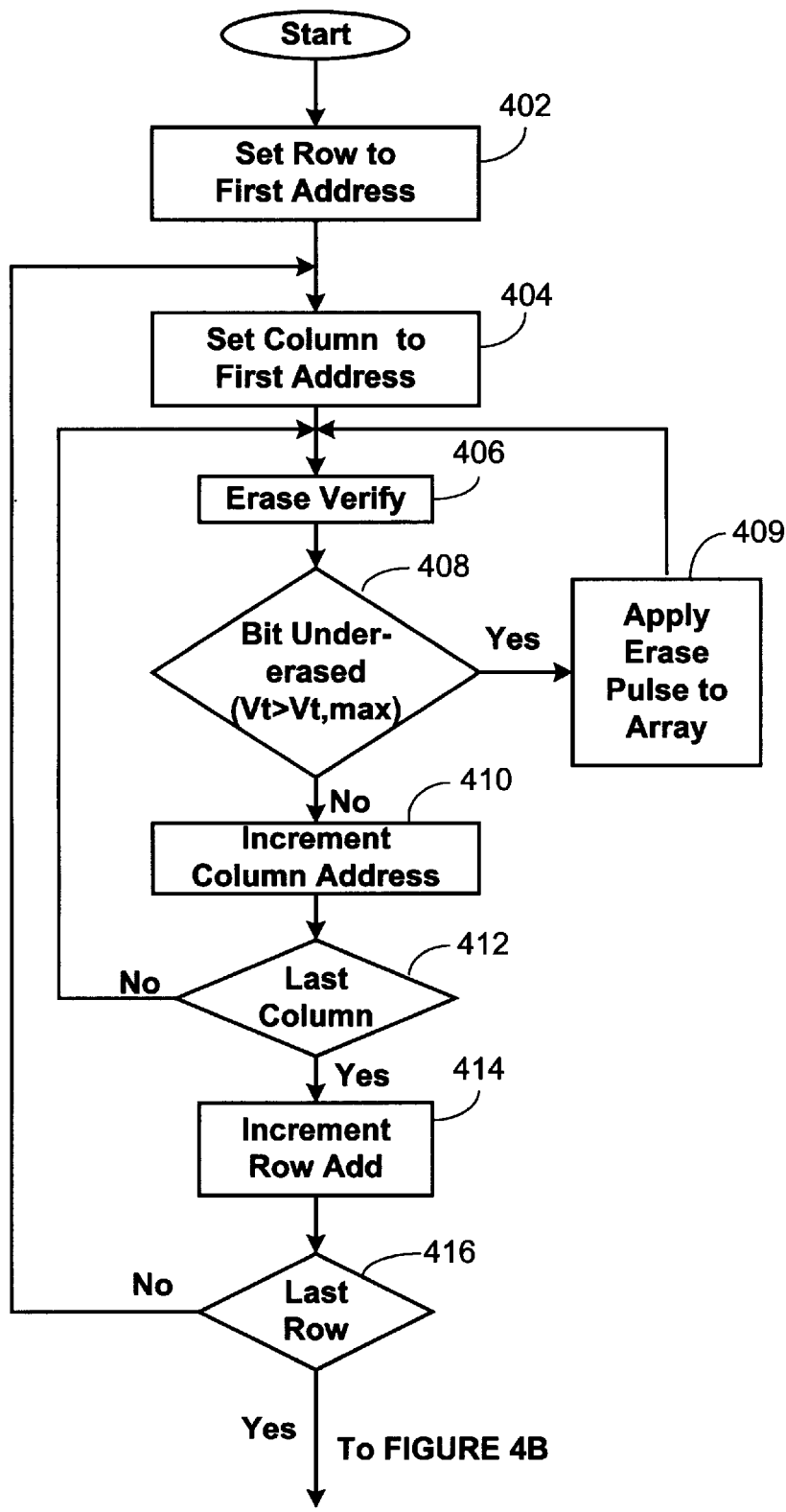
FIGS. 4A–4C show a flowchart of an erase and overerase correction method in accordance with the present invention.
Figure 4B:
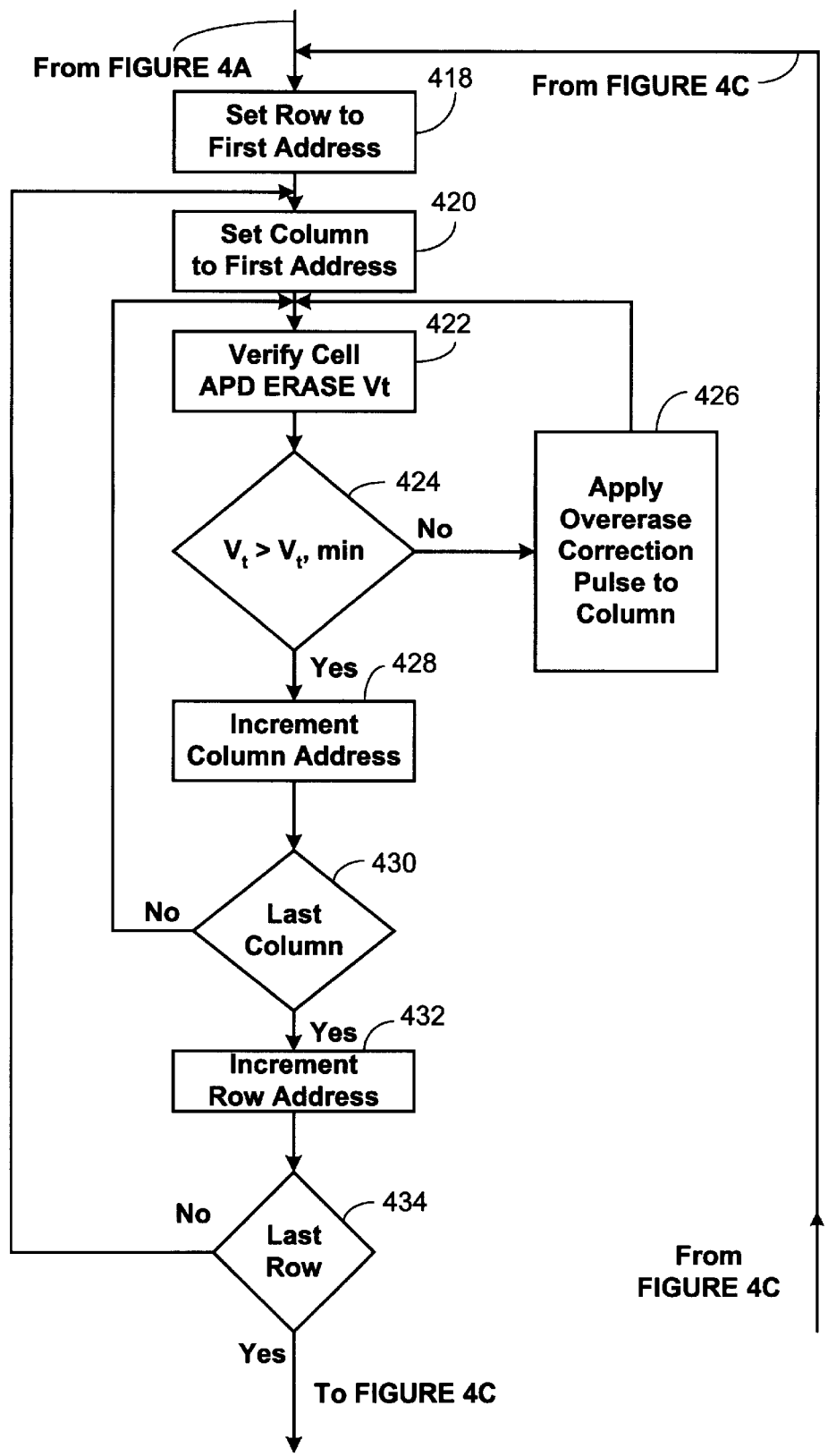
Figure 4C:
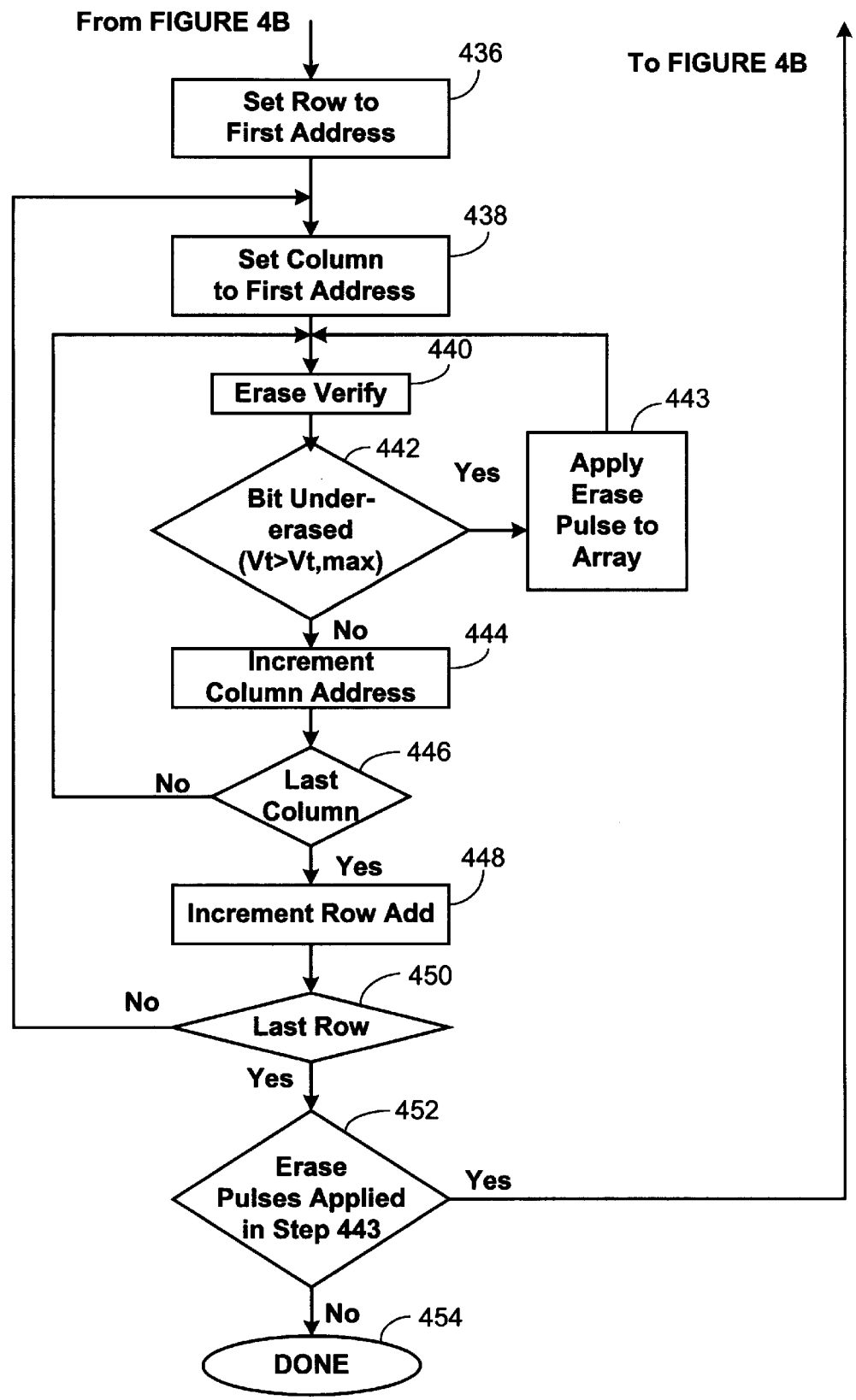
Figure 5:
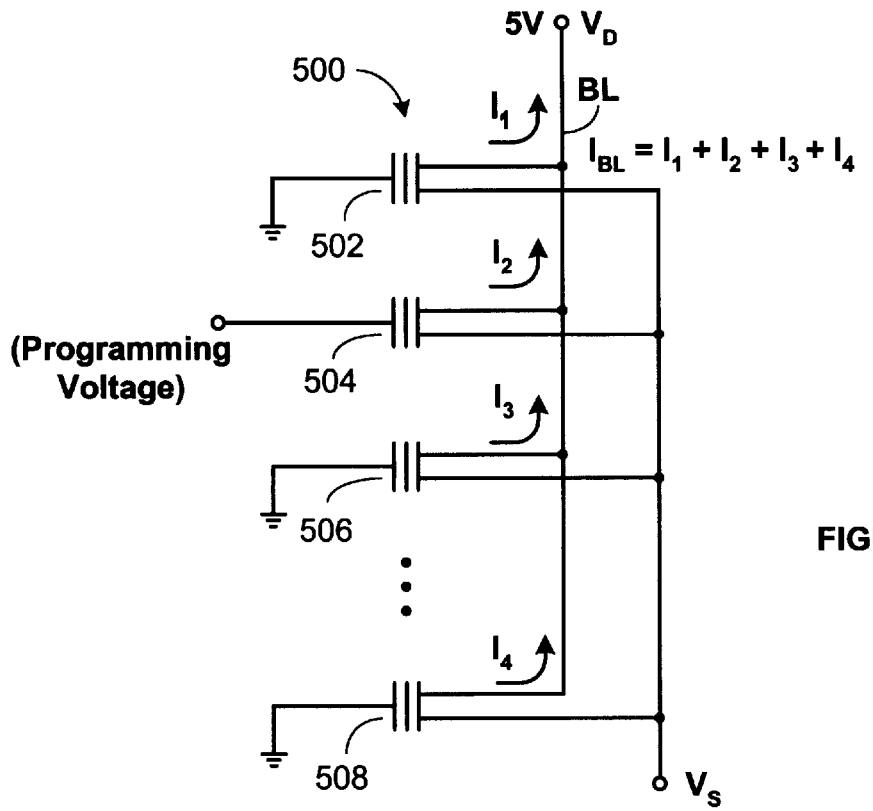
FIG. 5 is a schematic of a column of memory cells showing leakage current from cells not being programmed during a programming procedure.

FIGS. 4A through 4C show a flow chart of an erase and overerase correction method in accordance with the present invention. The method of the present invention is an erase procedure followed by an overerase correction procedure with a second erase procedure. The overerase correction procedure checks each bit, bit-by-bit, in the memory array for overerasure.

First, for the initial erase procedure, in steps 402 and 404, the row address and column address provided by processor 114 (FIG. 1) are set to an initial address. Next in steps 406 and 408, an erase verify pulse is provided to a cell as selected by the row and column addresses. Outputs from sense amplifies 116 (FIG. 1) are then utilized by processor 114 (FIG. 1) to determine if the threshold voltage $V_t$ of the cell referenced by the row and column addresses is greater than $V_t$,max, that is, to determine if the cell is undererased. If the cell is undererased an erase pulse is applied in step 409 to the entire array and the erase verify steps 406 and 408 are repeated.

If the cell referred to by the row and column addresses is not determined to be undererased in steps 406 and 408, the column address is incremented in step 410. Next, in step 412, if the last column address has not been exceeded, control returns to step 406. Otherwise, in step 414 the row address is incremented, and if the last row address has not been exceeded in step 416, control is returned to step 406. If the last row has been exceeded, the overerase correction procedure is initiated.

The overerase correction procedure is shown in FIG. 4B. In steps 418 and 420, the row address and column address provided by processor 114 (FIG. 1) are set to an initial address. Next, in the overerase correction procedure, in steps 422 and 424, power supply 112 (FIG. 1) is controlled to provide an overerase verify pulse to the bitline referred to by the column address. In addition, the row decoder 110 (FIG. 1) provides a gate voltage to the wordline referred to by the row address and grounds the unselected wordlines. The reference array 118 cell (APD ERASE $V_t$cell) used for overerase correction is set at a given minimum threshold voltage, $V_t$min, to provide a given value of reference current. The gate voltage of the bit being verified is set high enough to far exceed the current contribution of the unselected bits on the column. The benefit of this is that a large differential in current between the selected bit and the unselected bits on the bitline allows a reliable determination of the threshold voltage, $V_t$, of the cell being verified. If it is determined at 424 that the threshold voltage, $V_t$, of the bit being verified is below the minimum threshold voltage, $V_t$min, an overerase correction pulse is applied at 426 to the bitline referred to by the column address. If it is determined at 424 that the threshold voltage, $V_t$, of the bit being verified is still below the minimum threshold voltage, $V_t$min, another overerase correction pulse is applied at 426. This procedure is repeated until it is determined at 424 that the threshold voltage, $V_t$, of the bit being verified is above the minimum threshold voltage $V_t$min, at which point the column address is incremented at 428.

Next, in step 430, if the last column address has not been exceeded, control returns to step 422. Otherwise, in step 432 the row address is incremented, and if the last row address has not been exceeded in step 434, control is returned to step 420. If the last row has been exceeded, the next erase verify procedure is initiated.

The next erase verify procedure is shown in FIG. 4C. In steps 436 and 438, the row address and column address provided by processor 114 (FIG. 1) are set to an initial address. Next in steps 440 and 442, an erase verify pulse is provided to a cell as selected by the row and column addresses. Outputs from sense amplifies 116 (FIG. 1) are then utilized by processor 114 (FIG. 1) to determine if the cell referenced by the row and column addresses is undererased, that is, to determine of the threshold voltage, $V_t$, of the cell is above $V_t$max. If the cell is undererased an erase pulse is applied in step 443 to the entire array and the erase verify steps 440 and 442 are repeated.

If the cell referred to by the row and column addresses is determined to not be undererased in steps 440 and 442, the column address is incremented in step 410. Next, in step 446, if the last column address has not been exceeded, control returns to step 440. Otherwise, in step 448 the row address is incremented, and if the last row address has not been exceeded in step 450, control is returned to step 438. If the last row has been exceeded, it is determined at 452 if there were undererased bits determined at step 442 which necessitated the application of an erase pulse or erase pulses at step 443. If there has been the application of erase pulses at step 443 there may be memory cells that are now overerased and it is necessary to perform an overerase verify procedure. Therefore, if erase pulses have been applied to the memory array, control of the process is returned to step 418 (FIG. 4B) and an overerase verify procedure is conducted. In case the threshold voltages of a few bits shifted to lower than $V_t$min during the erase cycle, overerase correction is needed. If it is determined at step 452 that there were no erase pulses applied in step 443, the process is done as indicated at 454. It is contemplated that in most cases only one erase and overerase cycle will be needed.

Figure 1:
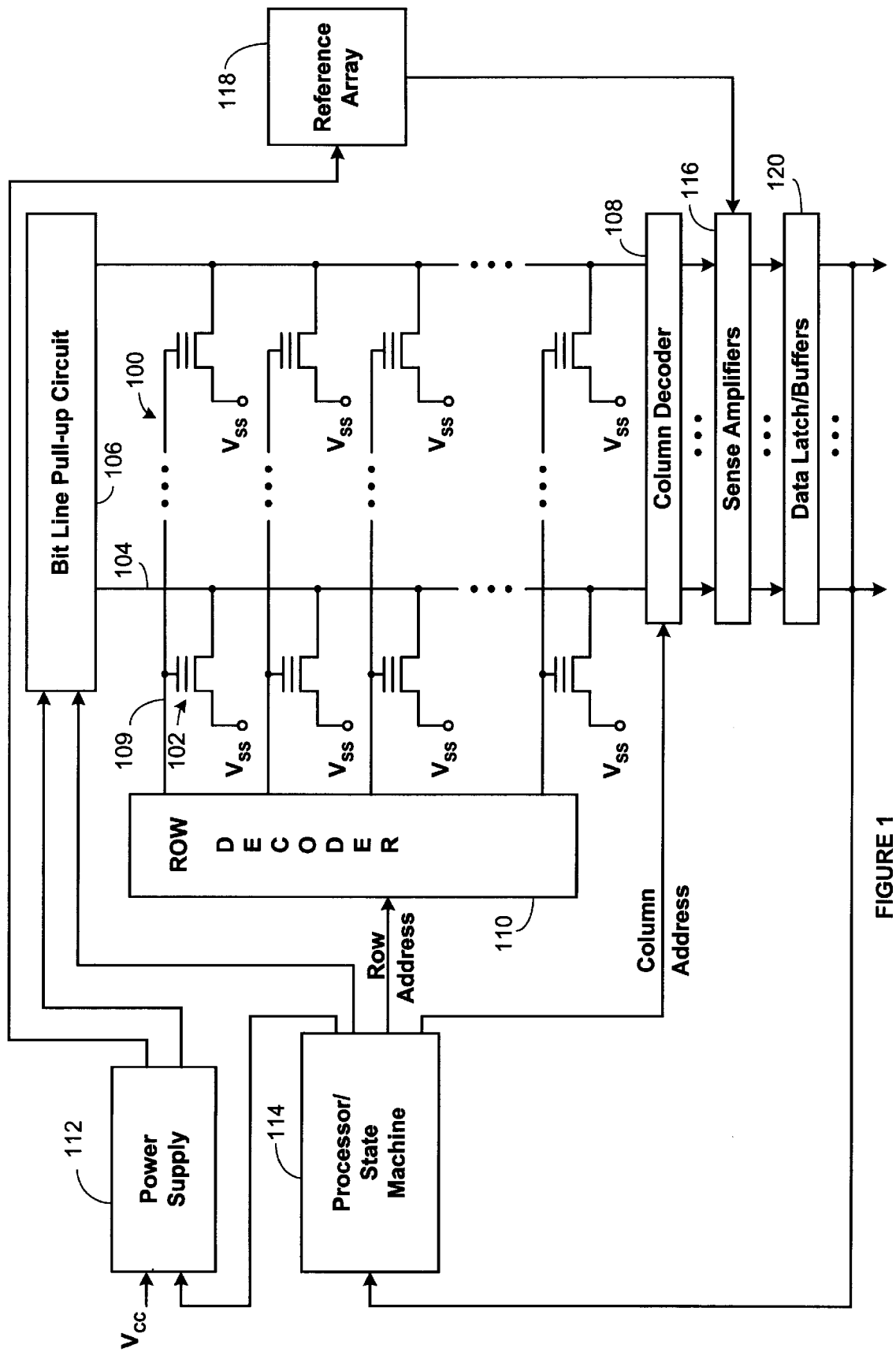
FIG. 1 shows a typical configuration of an integrated circuit including a flash EEPROM memory array and circuitry enabling programming, erasing, erase verify, reading, overerase correction, and overerase verify in the array.
Figure 2:
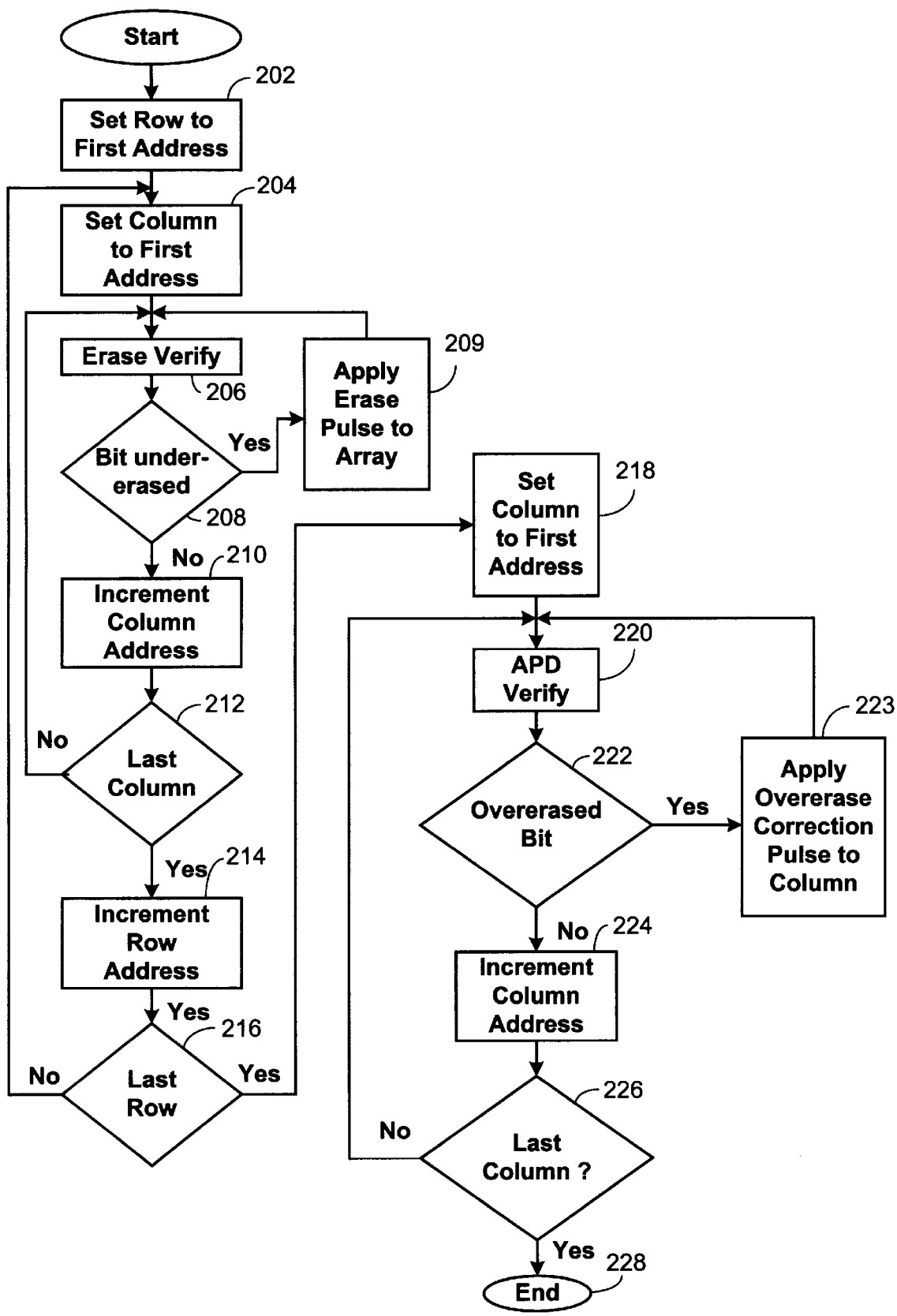
FIG. 2 is a flowchart of an erase and overerase correction method as known in the prior art.
Figure 3:
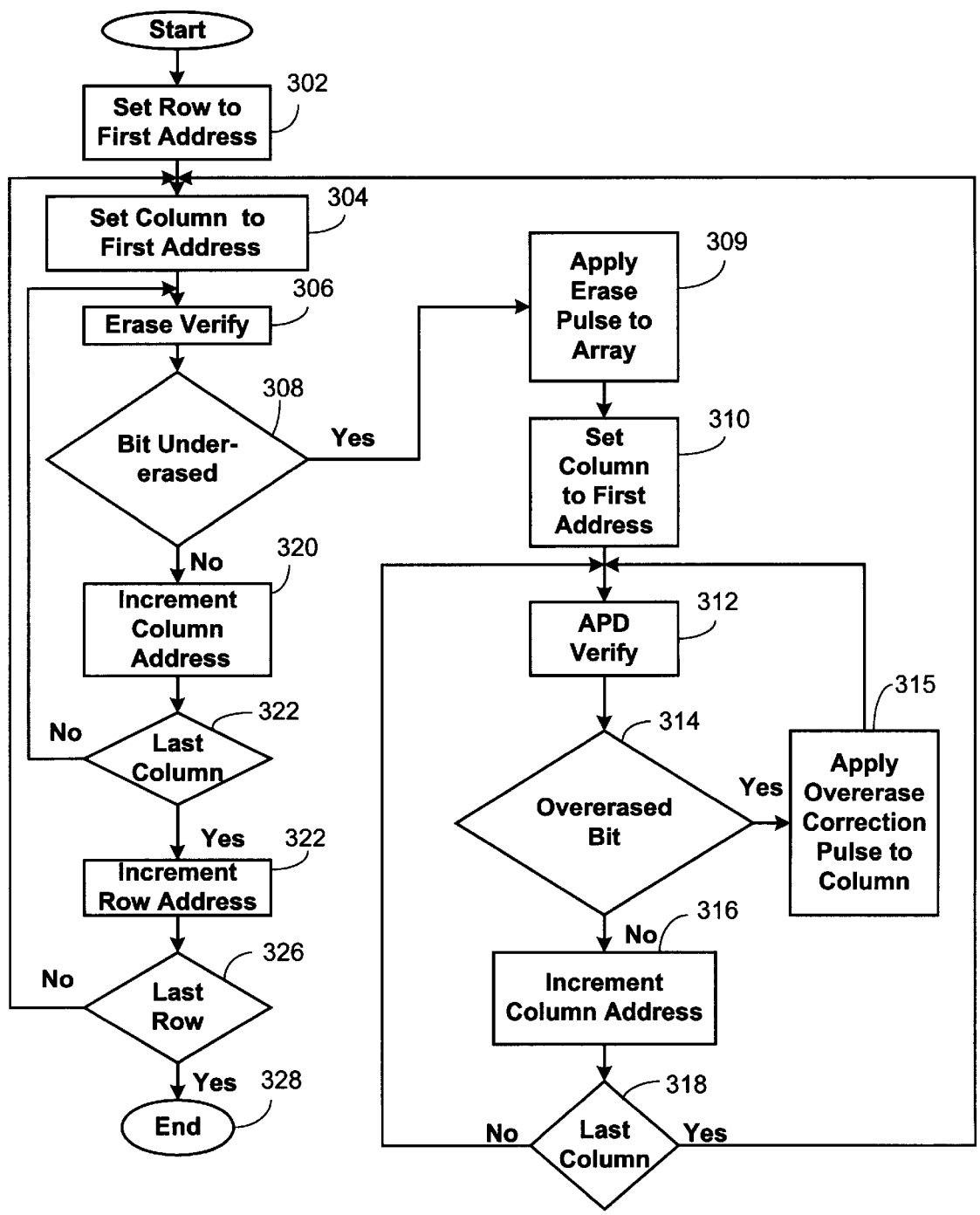
FIG. 3 is a flowchart of a second erase and overerase correction method as known in the prior art.
Figure 6:
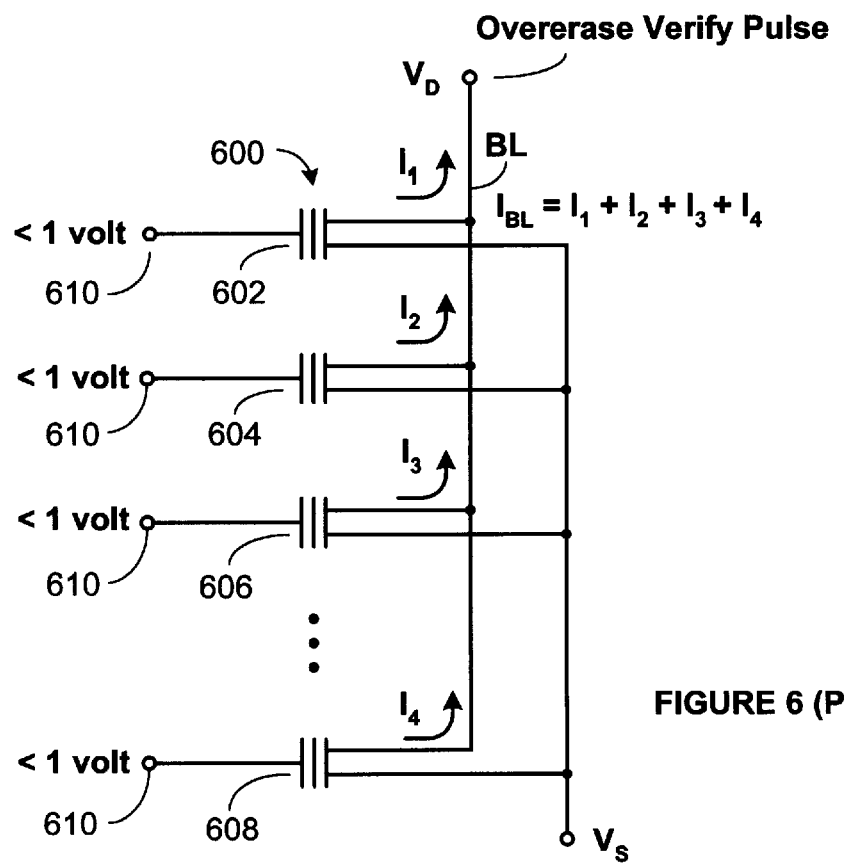
FIG. 6 is a schematic of a column of memory cells showing leakage current from cells during the application of an overerase verify pulse during a prior art method.

FIG. 6 shows how the overerase verify pulse is affected by leakage current during a prior art procedure. FIG. 6 shows a column of memory cells 600 that is being overerase verified. The column of memory cells includes cells 602, 604, 606 and 608 and as discussed above, in prior art overerase verify methods, the column is selected and all the wordlines are set to a low voltage typically less than 1 volt as shown at 610. As discussed above, the amount of current drawn during the overerase verify procedure is compared to a reference current from the reference array 118 (FIG. 1). Because there are as many as 512 cells in a typical array that may contribute to the leakage current, it is impossible to determine the threshold voltage, $V_t$, of an individual cell and further, it is impossible to accurately determine if any of the cells have a threshold voltage, $V_t$, above the minimum threshold voltage, $V_t$min.

Figure 7:
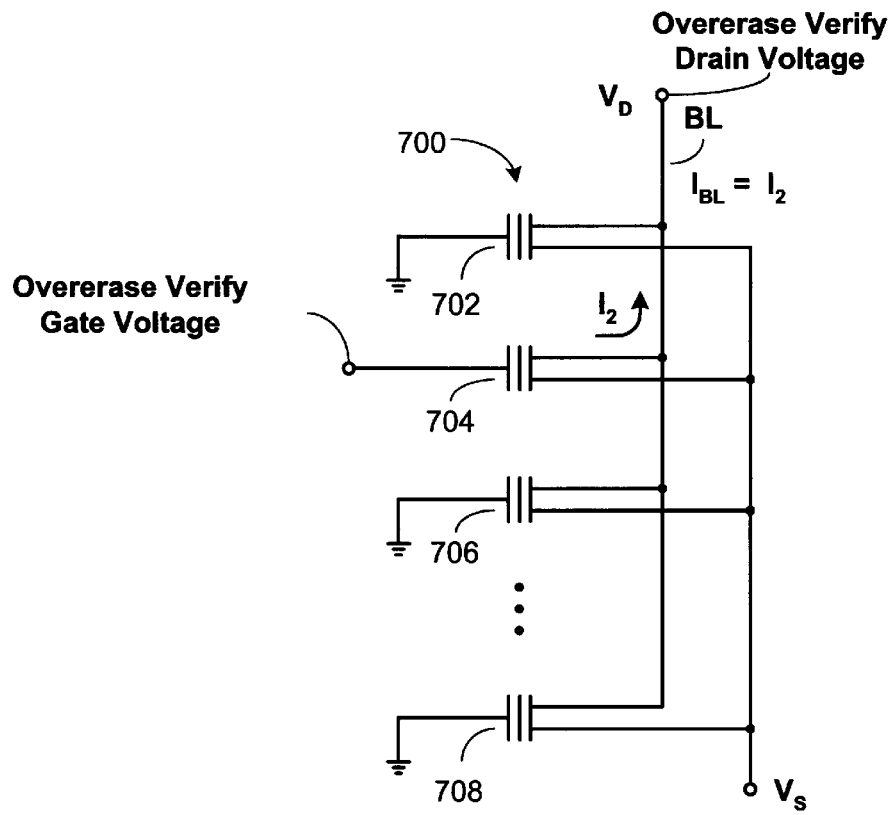
FIG. 7 is a schematic of a column of memory cells during the application of an overerase verify pulse in accordance with the present invention.

FIG. 7 shows how the overerase verify method of the present invention isolates the current from a targeted cell during the overerase verify procedure so that it can be individually compared to a reference current from the reference array 118 (FIG. 1). FIG. 7 shows a column of memory cells 700 that includes the cell being overerase verified. The column of memory cells includes cells 702, 704, 706 and 708. In accordance with the method of the present invention, when the column 700 is selected, a specific row (wordline) is selected and, as shown in FIG. 7, the wordline applies an overerase verify voltage of <5 volts to the control gate of memory cell 704. The wordlines for the unselected rows are grounded. The voltages selected during the overerase verify procedure are such that the only current on the bitline BL is the current $I_2$ from the memory cell 704 if it is overerased. This allows for an accurate and reliable determination of the threshold voltage, $V_t$, of the cell being verified.

Figure 8:
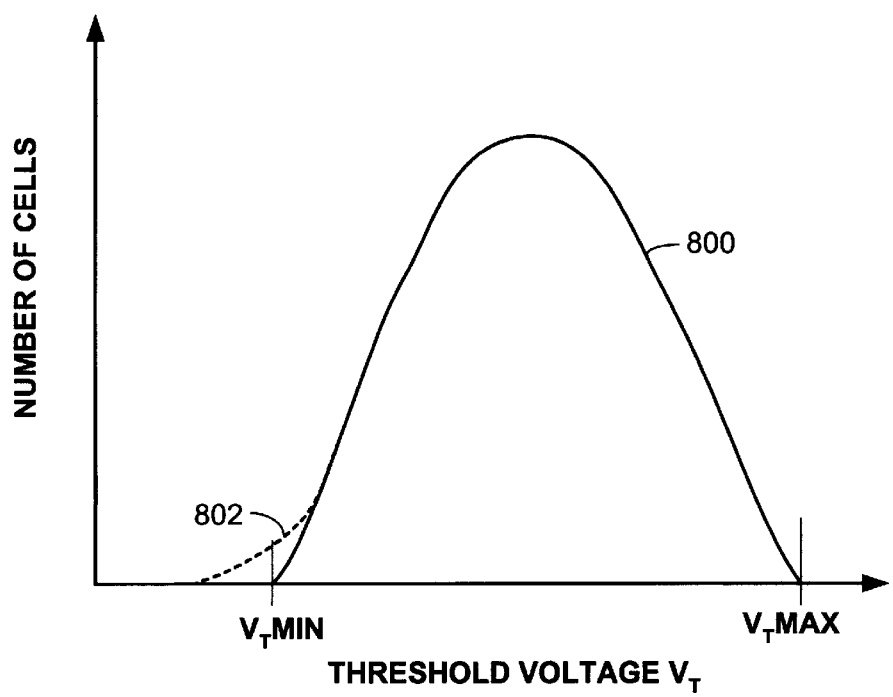
FIG. 8 is a graph of a threshold volt age distribution for a flash memory device.

FIG. 8 illustrates how the threshold voltages of the cells or bits in a flash EEPROM can differ following an erase operation. Curve 800 represents the number of cells having particular values of threshold voltage $V_T$. It will be seen that the least erased cells will have relatively high threshold voltages in the region of $V_t$max, whereas the most erased cells will have low threshold voltages in the region of $V_t$min that can be below $V_t$min as indicated by the dashed line 802. The characteristic curve illustrated in FIG. 8 is known as the threshold voltage distribution. The overerase correction procedure is designed to increase the threshold voltage of overerased cells from the area defined by the dashed line 802 to within the curve 800 without affecting (increasing) the threshold voltage of the least erased cells in the region of $V_t$max.

In summary, the results and advantages of the method and device of the present invention can now be more fully realized. The described method thus provides an accurate and reliable method of erase verifying and overerase verifying an array of memory cells.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of erase verifying and overerase verifying an array of flash memory cells, the method comprising:

(a) erase verifying a memory cell in a column and a row;

(b) if the memory cell is undererased applying an erase pulse to the array of flash memory cells;

(c) if the memory cell is properly erased erase verifying a next memory cell;

(d) repeating steps (a) through (c) until all memory cells in the array of flash memory cells verify as erased;

(e) overerase verifying a memory cell in a column and a row;

(f) if the memory cell is overerased applying an overerase correction pulse to the column in which the memory cell is located;

(g) if the memory cell is properly erased overerase verifying a next memory cell;

(h) repeating steps (e) through (g) until all memory cells in the array of flash memory cells overerase verify; and (i) repeating steps (a) through (c) until all memory cells in the array of flash memory cells verify as erased.

2. The method of claim 1 further comprising steps (j) determining after the completion of step (i) if erase pulses have been applied during step (i); and (k) repeating steps (e) through (k) if erase pulses have been applied during step (i).

3. The method of claim 2 wherein the step of overerase verifying a memory cell in a column and a row is accomplished by applying an overerase gate voltage to a control gate of the memory cell being overerase verified, applying an overerase verify pulse to a drain of the memory cell being overerase verified and comparing a threshold voltage of the memory cell being overerase verified to a threshold voltage of a reference cell.

4. The method of claim 3 wherein the threshold voltage of the reference cell is indicated by a reference current supplied by a reference cell in a reference array.

5. The method of claim 4 wherein the reference cell in the reference array has a threshold voltage set at a predetermined value.

6. The method of claim 5 wherein the predetermined value of the threshold voltage causes drain current that exceeds leakage current from non-selected memory cells in the memory array if the selected memory cell is overerased.

* * * * *